United States Patent
Pearlstein et al.

(10) Patent No.: US 12,518,966 B2
(45) Date of Patent: Jan. 6, 2026

(54) SELECTIVE PLASMA ENHANCED ATOMIC LAYER DEPOSITION

(71) Applicant: VERSUM MATERIALS US, LLC, Tempe, AZ (US)

(72) Inventors: Ronald M. Pearlstein, San Marcos, CA (US); Xinjian Lei, Vista, CA (US); Robert Gordon Ridgeway, Chandler, AZ (US); Aiping Wu, Chandler, AZ (US); Yi-Chia Lee, Chupei (TW); Sumit Agarwal, Arvada, CO (US); Rohit Narayanan Kavassery Ramesh, Golden, CO (US); Wanxing Xu, Golden, CO (US); Ryan James Gasvoda, Golden, CO (US)

(73) Assignee: Versum Materials US, LLC, Tempe, AZ (US)

( * ) Notice: Subject to any disclaimer, the term of this patent is extended or adjusted under 35 U.S.C. 154(b) by 407 days.

(21) Appl. No.: 18/254,477

(22) PCT Filed: Nov. 30, 2021

(86) PCT No.: PCT/US2021/061291
§ 371 (c)(1),
(2) Date: May 25, 2023

(87) PCT Pub. No.: WO2022/119865
PCT Pub. Date: Jun. 9, 2022

(65) Prior Publication Data
US 2024/0014036 A1 Jan. 11, 2024

Related U.S. Application Data

(60) Provisional application No. 63/182,581, filed on Apr. 30, 2021, provisional application No. 63/120,086, filed on Dec. 1, 2020.

(51) Int. Cl.
*H01L 21/02* (2006.01)
*C23C 16/02* (2006.01)
(Continued)

(52) U.S. Cl.
CPC ...... *H01L 21/0228* (2013.01); *C23C 16/0254* (2013.01); *C23C 16/04* (2013.01);
(Continued)

(58) Field of Classification Search
None
See application file for complete search history.

(56) References Cited

U.S. PATENT DOCUMENTS 9,816,180 B2   11/2017   Haukka et al.
10,043,656 B1   8/2018   Smith et al.
(Continued)

FOREIGN PATENT DOCUMENTS

WO   2019/023001 A1   1/2019

OTHER PUBLICATIONS

Loepp, G., et al. (1999). "Adsorption of Heptanethiol on Cu (110)" Langmuir 15 (11): 3767-3772.

*Primary Examiner* — Asok K Sarkar
(74) *Attorney, Agent, or Firm* — Daniel Roth; Versum Materials US, LLC

(57) ABSTRACT

A selective plasma enhanced atomic layer deposition (ALD) process is disclosed. The process may comprise loading a substrate comprising a dielectric material, and a metal, into a reactor. The substrate may be reacted with a non-plasma based oxidant, thereby forming an oxidized metal surface on the metal. The substrate may be heated and exposed to a passivation agent that adsorbs more onto the oxidized metal than the dielectric material. Such exposure may form a passivation layer on the oxidized metal surface, and the substrate may be exposed to a silicon precursor that adsorbs (Continued)

more onto the dielectric material that the passivation layer, forming a chemi-adsorbed silicon-containing layer on the dielectric material. The substrate may be exposed to a plasma based oxidant, that simultaneously partially oxidizes the passivation layer, and oxidizes the chemi-adsorbed silicon-containing layer to form a dielectric film on the dielectric material.

20 Claims, 7 Drawing Sheets

(51) Int. Cl.
  *C23C 16/04* (2006.01)
  *C23C 16/455* (2006.01)
(52) U.S. Cl.
  CPC .. *C23C 16/45525* (2013.01); *H01L 21/02126* (2013.01); *H01L 21/0214* (2013.01); *H01L 21/02164* (2013.01); *H01L 21/02274* (2013.01)

(56) References Cited

U.S. PATENT DOCUMENTS

| | | |
|---|---|---|
| 10,460,930 B2 | 10/2019 | Hausmann et al. |
| 2015/0299848 A1 | 10/2015 | Haukka et al. |
| 2017/0037513 A1 | 2/2017 | Haukka et al. |
| 2018/0211833 A1* | 7/2018 | Li .................. H01L 21/0228 |
| 2018/0233349 A1 | 8/2018 | Smith et al. |
| 2018/0254179 A1* | 9/2018 | Chan ............ H01L 21/76829 |
| 2018/0323055 A1 | 11/2018 | Woodruff et al. |
| 2018/0342388 A1 | 11/2018 | Chakraborty et al. |
| 2019/0017170 A1* | 1/2019 | Sharma .......... H01L 21/02181 |
| 2019/0157076 A1 | 5/2019 | Hausmann et al. |
| 2020/0090924 A1 | 3/2020 | Wu et al. |
| 2021/0301391 A1* | 9/2021 | Givens .................. C23C 16/56 |
| 2021/0301392 A1* | 9/2021 | Illiberi ................ C23C 18/1212 |

* cited by examiner

SELECTIVE PLASMA ENHANCED ATOMIC LAYER DEPOSITION

CROSS-REFERENCE TO RELATED APPLICATIONS

This application for patent is a National Stage filing under 35 U.S.C. 371 of International Patent Application No. PCT/US2021/061291, filed on Nov. 30, 2021, which claims priority to U.S. Patent Application having Ser. No. 63/120,086, filed on Dec. 1, 2020, and U.S. Patent Application having Ser. No. 63/182,581, filed on Apr. 30, 2021.

TECHNICAL FIELD

This disclosure generally relates selective atomic layer deposition (ALD), and more particularly to selective plasma enhanced ALD.

BACKGROUND

U.S. Pat. No. 9,816,180 discloses methods for selectively depositing onto a surface of a substrate relative to a second, different surface. An exemplary deposition method can include selectively depositing a material, such as a material comprising nickel, nickel nitride, cobalt, iron, and/or titanium oxide on a first surface, such as a $SiO_2$ surface, relative to a second, different surface, such as a H-terminated surface, of the same substrate. Methods can include treating a surface of the substrate to provide H-terminations prior to deposition.

U.S. Patent Application Publication U.S. 2018/0342388 discloses methods of selectively depositing organic and hybrid organic/inorganic layers. More particularly, embodiments of the disclosure are directed to methods of modifying hydroxyl terminated surfaces for selective deposition of molecular layer organic and hybrid organic/inorganic films. Additional embodiments of the disclosure relate to cyclic compounds for use in molecular layer deposition processes.

U.S. Patent Application Publication U.S. 2017/0037513 discloses methods for selectively depositing a material on a first metal or metallic surface of a substrate relative to a second, dielectric. surface of the substrate, or for selectively depositing metal oxides on a first metal oxide surface of a substrate relative to a second silicon oxide surface. The selectively deposited material can be, for example, a metal, metal oxide, metal nitride, metal silicide, metal carbide and/or dielectric material. In some embodiments a substrate comprising a first metal or metallic surface and a second dielectric surface is alternately and sequentially contacted with a first vapor-phase metal halide reactant and a second reactant. In some embodiments a substrate comprising a first metal oxide surface and a second silicon oxide surface is alternately and sequentially contacted with a first vapor phase metal fluoride or chloride reactant and water.

U.S. Pat. No. 10,460,930 discloses methods and apparatuses for selectively depositing silicon oxide on a dielectric surface relative to a metal-containing surface such as copper. Methods involve exposing a substrate having dielectric and copper surfaces to a copper-blocking reagent such as an alkyl thiol to selectively adsorb to the copper surface, exposing the substrate to a silicon-containing precursor for depositing silicon oxide, exposing the substrate to a weak oxidant gas and igniting a plasma to convert the adsorbed silicon-containing precursor to form silicon oxide, and exposing the substrate to a reducing agent to reduce exposure of any oxidized copper to the weak oxidant gas.

U.S. Patent Application Publication U.S. 2018/0211833 discloses processing platforms having a central transfer station with a robot and an environment having greater than or equal to about 0.1% by wt. water vapor, a pre-clean chamber connected to a side of the transfer station and a batch processing chamber connected to a side of the transfer station. The processing platform is configured to pre-clean a substrate to remove native oxides from a first surface, form a blocking layer using an alkylsilane and selectively deposit a film. Methods of using the processing platforms and processing a plurality of wafers are also described.

World Intellectual Property Organization Application Publication WO 2019/023001 discloses methods of selectively depositing a film on a hydroxide terminated surface relative to a hydrogen terminated surface. The hydrogen terminated surface is exposed to a nitriding agent to form an amine terminated surface which is exposed to a blocking molecule. to form a blocking layer on the surface. A film can then be selectively deposited on the hydroxide terminated surface.

U.S. Patent Application Publication U.S. 2018/0233349 discloses methods and apparatuses for selectively depositing silicon oxide on a silicon oxide surface relative to a silicon nitride surface. Methods involve pre-treating a substrate surface using ammonia and/or nitrogen plasma and selectively depositing silicon oxide on a silicon oxide surface using alternating pulses of an aminosilane silicon precursor and an oxidizing agent in a thermal atomic layer deposition reaction without depositing silicon oxide on an exposed silicon nitride surface.

U.S. Pat. No. 10,043,656 discloses methods and apparatuses for selectively depositing silicon-containing dielectric or metal containing dielectric material on silicon or metal surfaces selective to silicon oxide or silicon nitride materials. Methods involve exposing the substrate to an acyl chloride which is reactive with the silicon oxide or silicon nitride material where deposition is not desired to form a ketone structure that blocks deposition on the silicon oxide or silicon nitride material. Exposure to the acyl chloride is performed prior to deposition of the desired silicon-containing dielectric material or metal-containing dielectric material.

U.S. Patent Application Publication U.S. 2018/0323055 discloses a method for selectively forming a silicon nitride film on a substrate comprising a first metallic surface and a second dielectric surface by a cyclical deposition process. The method may comprise contacting the substrate with a first reactant comprising a silicon halide source and contacting the substrate with a second reactant comprising a nitrogen source, wherein the incubation period for the first metallic surface is less than the incubation period for the second dielectric surface. Semiconductor device structures comprising a selective silicon nitride film are also disclosed.

U.S. Patent Application Publication U.S. 2020/0090924 discloses methods of depositing a metal oxide film on a metal layer relative to a dielectric layer by exposing a substrate to an organometallic precursor followed by exposure to an oxidant.

Loepp, G., et al. (1999). "Adsorption of Heptanethiol on Cu (110)" Langmuir 15 (11): 3767-3772 discloses the adsorption kinetics of heptanethiol $[CH_3(CH_2)_6SH]$ on Cu(110) and the ordering of monolayer films prepared by ultrahigh vacuum vapor deposition have been studied by means of thermal-desorption spectroscopy, XPS, LEED, and scanning tunneling microscopy.

There is a need in the art to provide a method of deposition of silicon dielectric materials, such as silicon oxide, carbon doped silicon oxide, and carbon doped silicon oxynitride, selectively on top of a dielectric surface relative to a metal surface by a plasma enhanced atomic layer deposition semiconductor manufacturing process.

SUMMARY OF THE INVENTION

In accordance with a first aspect of the present disclosure, a selective plasm enhanced atomic layer deposition (ALD) process is disclosed. In this first aspect of the invention disclosed herein, a surface of a metal on a substrate may not be oxidized, and therefore require an oxidation step to better enable the metal to interact with a passivation agent. As such, this method may include (a) loading the substrate comprising a dielectric material, and the metal into a reactor. The substrate may be (b) reacted with a non-plasma based oxidant, thereby forming an oxidized metal surface on the metal. The substrate may be (c) heated to a temperature less than, or equal to, 150° C., and then (d) exposed to a passivation agent that preferentially adsorbs more onto the oxidized metal surface than the dielectric material, thereby forming a passivation layer on the oxidized metal surface. Next, the substrate may be (e) exposed to a silicon precursor that preferentially adsorbs more onto the dielectric material than the passivation layer, thereby forming a chemi-adsorbed silicon-containing layer on the dielectric material. Finally, the substrate may then be (f) exposed to a plasma based oxidant, and this exposure simultaneously (1) partially oxidizes the passivation layer, thereby forming a partially oxidized passivation layer on the oxidized metal surface, and (2) oxidizes the chemi-adsorbed silicon-containing layer, thereby forming a silicon-containing dielectric film on the dielectric material.

In accordance with a second aspect of the invention, an additional selective plasma enhanced atomic layer deposition (ALD) process is disclosed. The second method may include (g) loading the substrate comprising a dielectric material, and metal having a native metal oxide surface into a reactor. The substrate may be (h) heated to a temperature less than, or equal to, 150° C., and then (i) exposed to a passivation agent that preferentially adsorbs more onto the native metal oxide surface than the dielectric material, thereby forming a passivation layer on the native metal oxide surface. Next, the substrate may be (j) exposed to a silicon precursor that preferentially adsorbs more onto the dielectric material than the passivation layer on the native metal oxide surface, thereby forming a chemi-adsorbed silicon-containing layer on the dielectric material. Then, the substrate may be (k) exposed to a plasma based oxidant that simultaneously (1) partially oxidizes the passivation layer on the native metal oxide surface, thereby forming a partially oxidized passivation layer on the native metal oxide surface, and (2) oxidizes the chemi-adsorbed silicon-containing layer on the dielectric material, thereby forming a silicon-containing dielectric film on the dielectric material.

DETAILED DESCRIPTION

Figure 1:
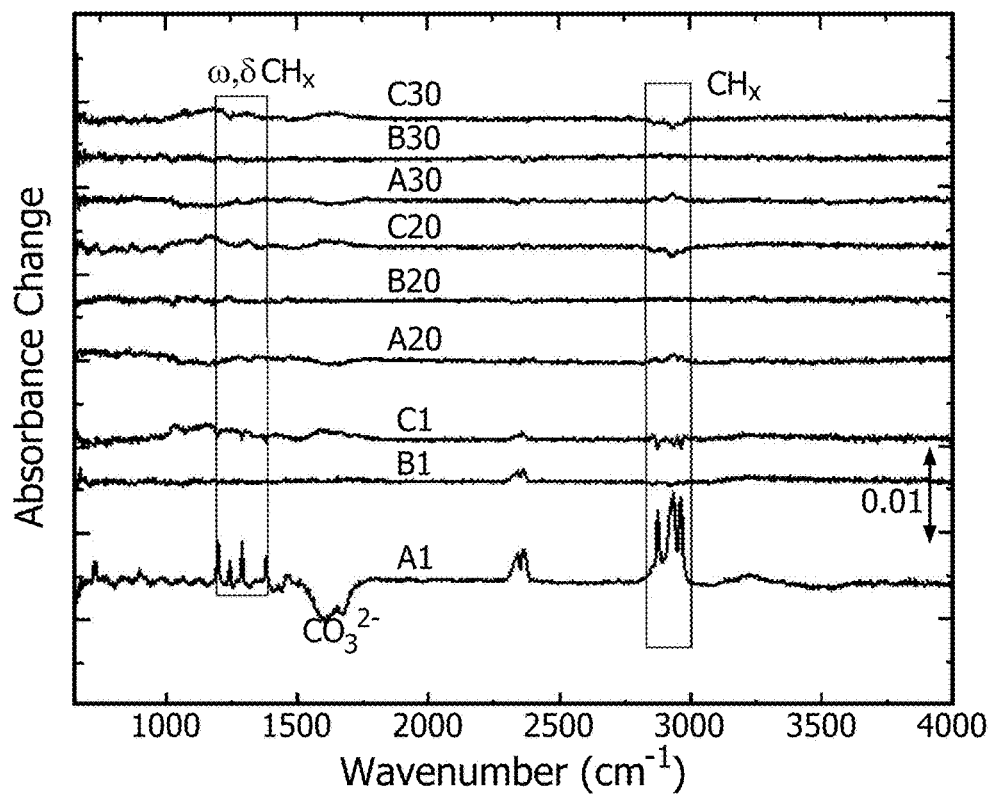
FIG. 1 shows infrared absorbance change during A-B-C type ALD process for the $1^{st}$, $20^{th}$, and $30^{th}$ cycles wherein A=HTT, B=DSBAS, C=remote oxygen plasma at 100° C. as described in Working Example 2. The selectivity is retained during these 30 cycles.
Figure 1:
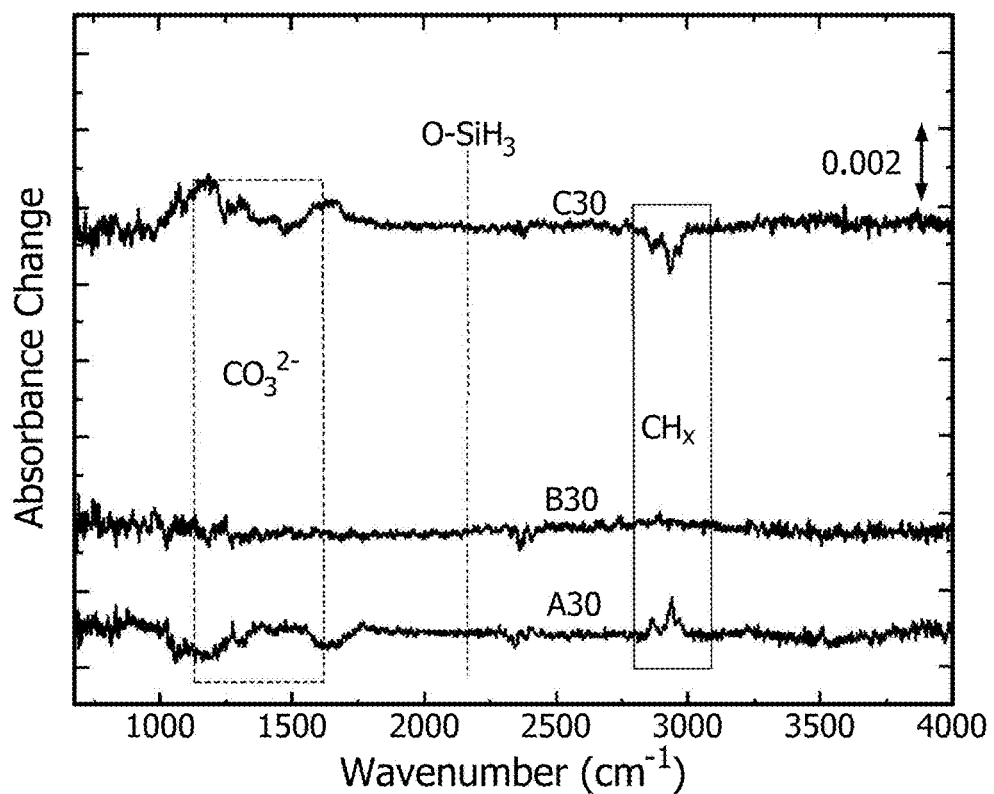
Figure 2:
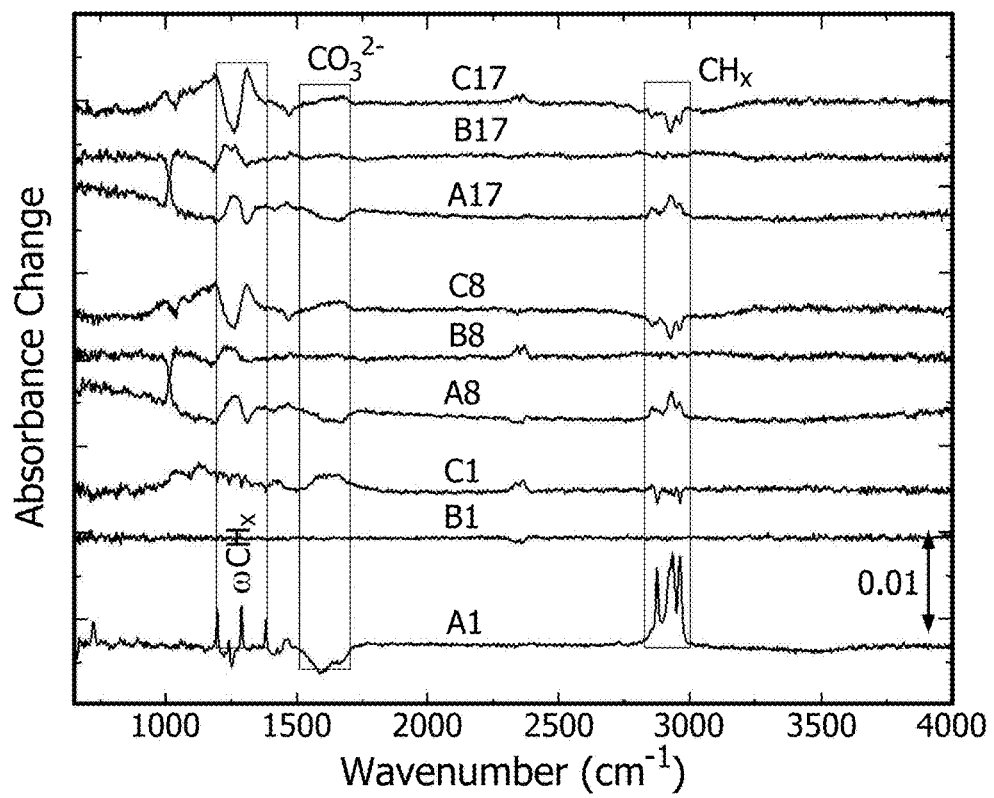
FIG. 2 shows infrared absorbance change during A-B-C type ALD process for the $1^{st}$, $8^{th}$, and $17^{th}$ cycles wherein A=HTT, B=2-dimethylamino-2,4,6,8-tetramethylcyclotetrasiloxane, C=remote oxygen plasma at 100° C. as described in Working Example 2. The selectivity is retained during these 17 cycles.
Figure 2:
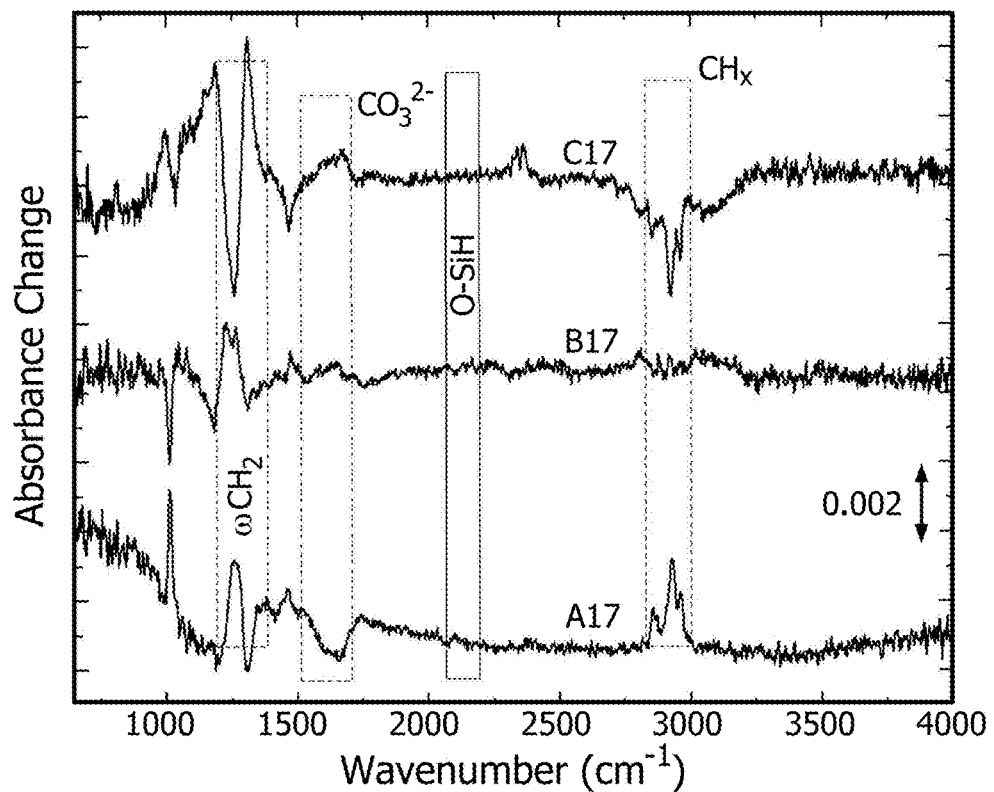
Figure 3:
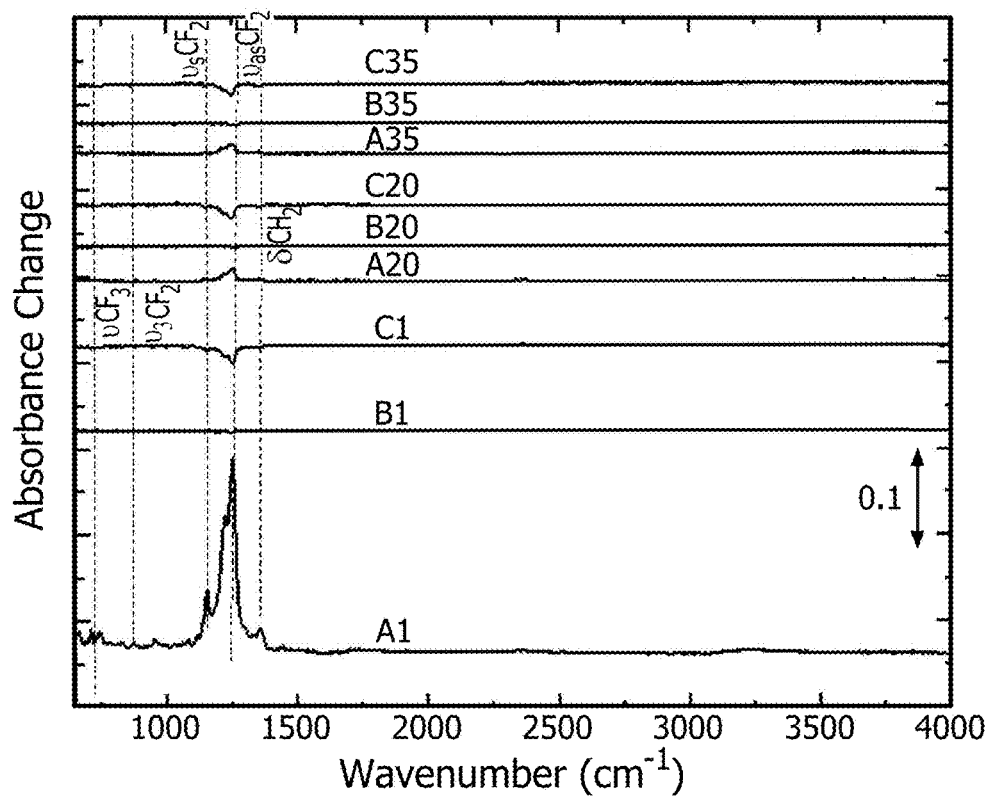
FIG. 3 shows infrared absorbance change during A-B-C type ALD process for the $1^{st}$, $20^{th}$, and $35^{th}$ cycles wherein A=PFDT, B=DSBAS, C=remote oxygen plasma at 100° C. as described in Working Example 3. The selectivity is retained during these 35 cycles.
Figure 3:
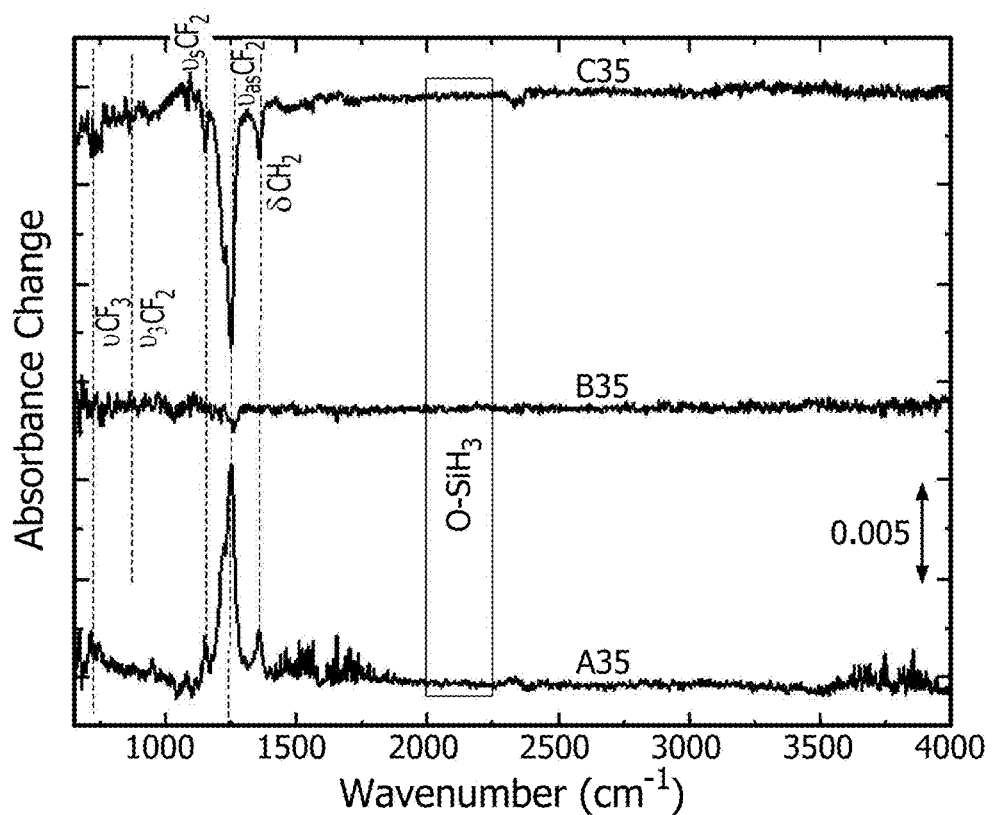
Figure 4:
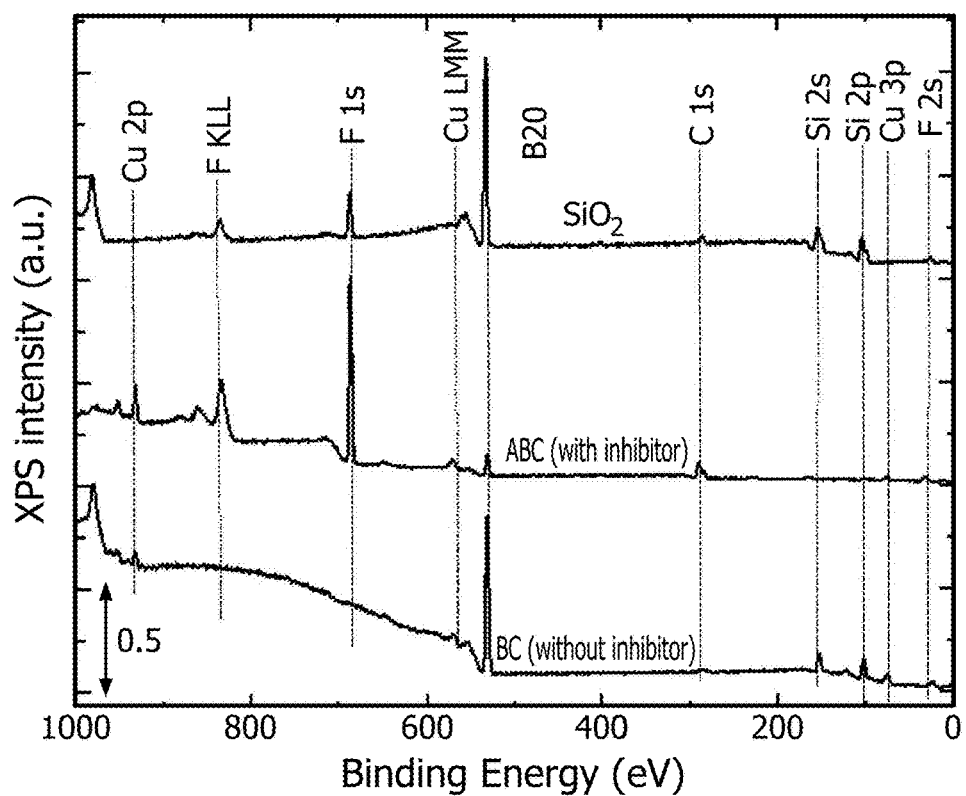
FIG. 4 shows X-ray photoelectron spectroscopy (XPS) survey and high-resolution spectra of the Si 2p region for A-B-C (with inhibitor) and B-C (without inhibitor) type ALD processes at 100° C. as described in Example 3, wherein A=PFDT, B=DSBAS, C=remote oxygen plasma at 100° C. The PFDT inhibitor blocks silicon and oxygen containing dielectric growth on the copper surface for 35 cycles.
Figure 4:
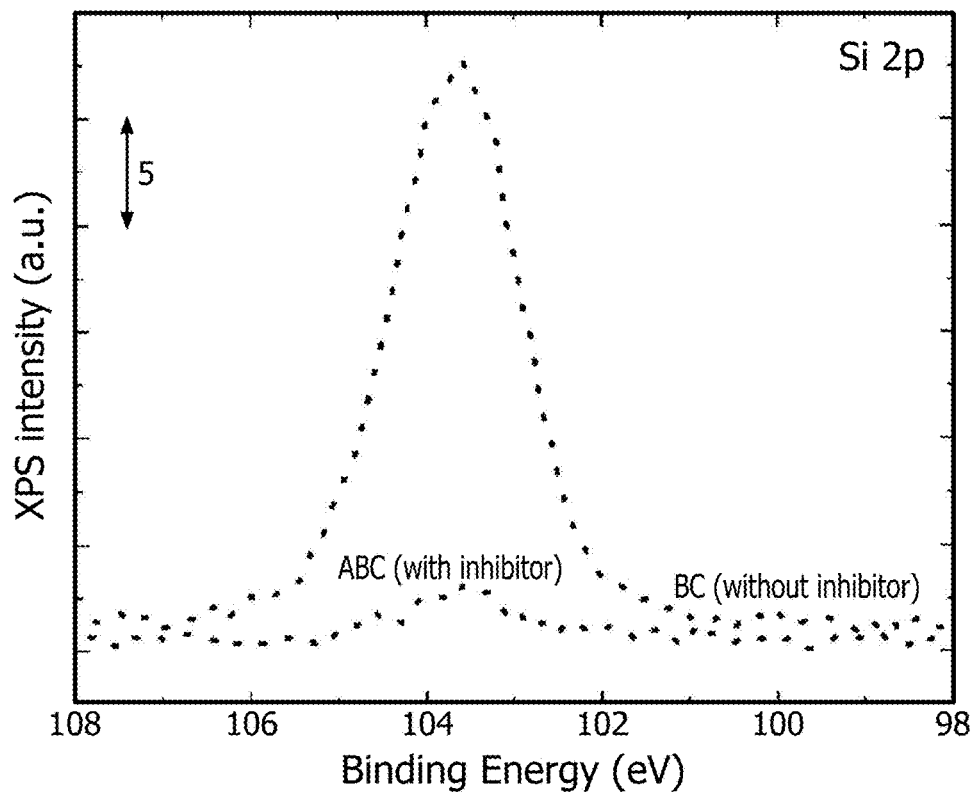

Various aspects of the disclosure will now be described with reference to the drawings and tables disclosed herein, if applicable, with like reference numbers referring to like elements, unless specified otherwise. As described above, a need exists in the art to deposit silicon dielectric materials, such as silicon oxide, carbon doped silicon oxide, and carbon doped silicon oxynitride, selectively on top of a dielectric surface relative to a metal surface in a semiconductor manufacturing process utilizing a plasma enhanced process. As such, the Applicant researched means to achieve the above.

Accordingly, disclosed herein in a first aspect of the invention, is a novel, and non-obvious, selective plasma enhanced atomic layer deposition (ALD) process, that selectively deposits silicon dielectric materials on top of a dielectric material relative to a metal, in an ALD reactor. In this first aspect of the invention disclosed herein, a surface of a metal on a substrate may not be oxidized, and therefore require an oxidation step to better enable the metal to interact with a passivation agent. As such, this method may include (a) loading the substrate comprising a dielectric material, and the metal into a reactor. The substrate may be (b) reacted with a non-plasma based oxidant, thereby forming an oxidized metal surface on the metal. The substrate may be (c) heated to a temperature less than, or equal to, 150° C., and then (d) exposed to a passivation agent that preferentially adsorbs more onto the oxidized metal surface than the dielectric material, thereby forming a passivation layer on the oxidized metal surface. Next, the substrate may be (e) exposed to a silicon precursor that preferentially adsorbs more onto the dielectric material than the passivation layer, thereby forming a chemi-adsorbed silicon-containing layer on the dielectric material. Finally, the substrate may then be (f) exposed to a plasma based oxidant, and this exposure simultaneously (1) partially oxidizes the passivation layer, thereby forming a partially oxidized passivation layer on the oxidized metal surface, and (2) oxidizes the chemi-adsorbed silicon-containing layer, thereby forming a silicon-containing dielectric film on the dielectric material.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. In a preferred embodiment of this method, the dielectric material may be selected from the group consisting of silicon oxide, carbon doped silicon oxide, silicon oxynitride, carbon doped oxynitride, silicon nitride, and metal oxide such as zirconium oxide, hafnium oxide, silicon doped zirconium oxide, silicon doped hafnium oxide, or any other high k materials. The metal in a preferred embodiment may be selected from selected from the group consisting of cobalt, aluminum, copper, tantalum, ruthenium, molybdenum, tungsten, platinum, iridium, nickel, titanium, silver, gold, or a combination thereof.

Additionally, the non-plasma based oxidant may be selected from the group consisting of hydrogen peroxide (gaseous), oxygen, and ozone, in the preferred embodiment of this method. More particularly, however, in the preferred embodiment, step (b), the reacting the substrate with a non-plasma based oxidant, thereby forming an oxidized metal surface on the metal step, occurs at a temperature less than, or equal to, 500° C. In a more preferred embodiment, step (b), the reacting the substrate with a non-plasma based oxidant, thereby forming an oxidized metal surface on the metal step, occurs at a temperature less than, or equal to, 150° C. In additional embodiments, step (b), the reacting the substrate with a non-plasma based oxidant, thereby forming an oxidized metal surface on the metal step, occurs at a temperature less than, or equal to: 145° C.; 140° C.; 135° C.; 130° C.; 125° C.; 120° C.; 115° C.; 110° C.; 105° C.; 100° C.; 95° C.; 90° C.; 85° C.; 80° C.; 75° C.; 70° C.; 65° C.; 60° C.; 55° C.; or 50° C.

As described above, the substrate may be independently heated to less than, or equal to, 150° C., in step (c). In additional embodiments of this method, the substrate in step (c) may be heated to a temperature of less than, or equal to: 145° C.; 140° C.; 135° C.; 130° C.; 125° C.; 120° C.; 115° C.; 110° C.; 105° C.; 100° C.; 95° C.; 90° C.; 85° C.; 80° C.; 75° C.; 70° C.; 65° C.; 60° C.; 55° C.; or 50° C.

Moving on, in one alternative of a preferred embodiment of this method, the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol. In another alternative of this method, the passivation agent is selected from the group consisting of di-tert-butyl disulfide, and di-heptane disulfide. In a further alternative of a preferred embodiment of this method, the passivation agent may be selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl)benzenethiol, 4-trifluoromethyl-2,3,5,6-tetrafluorothiophenol, 3,5-difluorobenzyl mercaptan, 4-trifluoromethyl-2,3,5,6-tetrafluorothiophenol, and para-trifluoromethylbenzenethiol.

In a preferred embodiment, the passivation layer may comprise a monolayer of the passivation agent adsorbed to the oxidized metal surface. More specifically, the monolayer of the passivation agent may be chemi-adsorbed to the oxidized metal surface. In an additional aspect of the preferred embodiment, the passivation layer may further comprise a second layer of the passivation agent that is physiadsorbed to the monolayer of the passivation agent that is chemi-adsorbed to the oxidized metal surface.

In a preferred embodiment of this aspect of the invention, the silicon precursor may be an organoaminomonsilane selected from the group consisting of di-iso-propylaminosilane, di-sec-butylaminosilane, bis(diethylamino)silane, bis(dimethylamino)silane, bis(ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, Iso-propylaminodimethylsilane, tert-pentylaminodimethylaminosilane, dimethylaminomethylsilane, di-iso-propylaminomethylsilane, iso-propyl-sec-butylaminomethylsilane, 2,6-dimethylpiperidinomethylsilane, di-sec-butylaminomethylsilane, bis(dimethylamino)methylsilane, bis(diethylamino)methylsilane, bis(di-iso-propylamino)methylsilane, bis(iso-propyl-sec-butylamino)methylsilane, bis(2,6-dimethylpiperidino)methylsilane, bis(iso-propylamino)methylsilane, bis(tert-butylamino)methylsilane, bis(sec-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, bis(cyclohexylamino)dimethylsilane, and combinations thereof.

Alternatively, the silicon precursor may be an organoaminodisilane selected from the group consisting of di-iso-propylaminodisilane, and di-sec-butylaminodisilane in the preferred embodiment in this aspect of the invention. Further, in an additional alternative of this preferred embodiment of the method, the silicon precursor may be an organoaminotrisilylamine selected from the group consisting of di-iso-propylaminotrisilylamine, diethylaminotrisilylamine, iso-propylaminotrisilylamine, and cyclohexylmethylaminotrisilylamine.

In an additional alternative to the preferred embodiment of the method disclosed herein, the silicon precursor may be an organoaminocyclosiloxane selected from the group consisting of 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino- 2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane, 2-pyrrolidino-2,4,6,8-tetramethylcyclotetrasiloxane, and 2-cyclohexylmethylamino-2,4,6,8-tetramethylcyclotetrasiloxane.

The plasma based oxidant utilized in step (f) can be any plasma that simultaneously (1) partially oxidizes the passivation layer, thereby forming a partially oxidized passivation layer on the oxidized metal surface, and (2) oxidizes the chemi-adsorbed silicon-containing layer, thereby forming a silicon-containing dielectric film on the dielectric material. More specifically, however, the plasma based oxidant may be selected from the group consisting of oxygen plasma, nitrous oxide plasma, and carbon dioxide plasma.

Additionally, in a preferred embodiment of the method, the silicon-containing dielectric film may have a thickness, and the thickness required may be a predetermined value. For example, in order to meet performance requirements, the film thickness may need to be: greater than, or equal to, nanometers; greater than, or equal to, 10 nanometers; greater than, or equal to, 15 nanometers; greater than, or equal to, 20 nanometers; greater than, or equal to, 25 nanometers; greater than, or equal to, 30 nanometers; greater than, or equal to, 35 nanometers; greater than, or equal to, 40 nanometers; greater than, or equal to, 45 nanometers; or greater than, or equal to, 50 nanometers. As such, one embodiment of this method may include repeating steps (d) through (f) until the thickness of the silicon-containing dielectric film formed on the dielectric material reaches the predetermined value. In an alternative of this portion of the process, the substrate may not need to be exposed to the passivation agent between exposures to the silicon precursor that preferentially adsorbs more onto the dielectric material than the passivation layer. As such, in some instances wherein the silicon-containing dielectric film has a thickness, the preferred embodiment of this method only includes repeating steps (e) through (f), not steps (d) through (f), until the thickness of dielectric film formed on the dielectric material reaches the predetermined value.

Accordingly, each exposure in steps (d) through (f) may create a known thickness of the dielectric film. For example, each cycle of steps (d) through (f) may hypothetically create a silicon-containing dielectric film approximately 10 nanometers thick. Further, film property testing may have determined that such film requires a thickness of approximately 40 nanometers to create the film properties sought, and steps (d) through (f) would need to be repeated for four cycles to create a film approximately 40 nanometers thick. As such, in another alternative of the preferred embodiment of this method, steps (d) through (f) may be repeated for a predetermined number of cycles, as described just above, to obtain the prescribed thickness. In one instance the predetermined number of cycles may be 1. Alternatively, the predetermined number of cycles may be: 2; 3; 4; 5; 6; 7; 8; 9; 10; 11; 12; 13; 14; 15; 16; 17; 18; 19; 20; 21; 22; 23; 24; 25; or more, for example. In an alternative of this portion of the process, the substrate may not need to be exposed to the passivation agent between exposures to the silicon precursor that preferentially adsorbs more onto the dielectric material than the passivation layer. As such, in some instances wherein the silicon-containing dielectric film has a thickness, the preferred embodiment of this method only includes repeating steps (e) through (f), not steps (d) through (f), for the predetermined number of cycles.

In an additional limitation to the preferred embodiment of this method disclosed herein, the reactor may be purged between steps. For example, in one embodiment the reactor may be purged between steps (d) and (e). In another instance, the reactor may be purged between the steps (e) and (f). In a further embodiment, the reactor may be purged between steps (d) and (e), as well as between steps (e) and (f). The reactor purge between any of the steps described above may be selected from the group consisting of flushing the reactor with an inert gas, and exposing the reactor to a vacuum source. Example inert gases that may be utilized include, but are not limited to, helium, argon, and nitrogen.

Selective Plasma Enhanced Deposition of Dielectric Materials Manufactured in Accordance with the First Aspect of the Invention Disclosed Herein Working Example 1—$O_3$ as the Non-plasma Based Oxidant, Heptanethiol (HTT) as the Passivation Agent, di-sec-butylaminosilane (DSBAS), or 2-dimethylamino-2,4,6,8-tetramethylcyclotetrasiloxane, as the Silicon Precursor, and Oxygen as the Plasma Based Oxidant.

Silicon wafer substrates with electroplated copper on their surface would be planarized by chemical mechanical planarization and placed in a vacuum chamber. Next, the substrate would be exposed to 03 to create an oxidized metal surface. The substrate would then be heated to 150° C. and a protective film of a passivation agent was deposited by introducing heptanethiol vapor at a pressure of 0.38 Torr (50 Pa) for 130 seconds followed by an argon purge for 60 seconds to remove unreacted thiol. The substrate would then be treated with di-sec-butylaminosilane vapor at 0.35 Torr (47 Pa) for 57 s at 150° C. followed by argon purge for 60 seconds. Next, the substrate would be exposed to an oxygen plasma while maintaining the temperature at 150° C. followed by a 30 seconds of argon purge. The process could be repeated multiple times.

As noted above, in the first aspect of the invention disclosed herein, the surface of the metal on the substrate may not be oxidized, and therefore requires an oxidation step to better enable the metal to interact with the passivation agent. In other instances, the surface of the metal on the substrate may be sufficiently oxidized for it to better interact with the passivation agent. For example, the surface of the metal may be a native oxide. As such, in a second aspect of this disclosure, another novel, and non-obvious, selective thermal atomic layer deposition (ALD) process that selectively deposits silicon dielectric materials on top of a dielectric material, relative to a metal, in an ALD reactor is disclosed.

More specifically, this second method may include (g) loading the substrate comprising a dielectric material, and metal having a native metal oxide surface into a reactor. The substrate may be (h) heated to a temperature less than, or equal to, 150° C., and then (i) exposed to a passivation agent that preferentially adsorbs more onto the native metal oxide surface than the dielectric material, thereby forming a passivation layer on the native metal oxide surface. Next, the substrate may be (j) exposed to a silicon precursor that preferentially adsorbs more onto the dielectric material than the passivation layer on the native metal oxide surface, thereby forming a chemi-adsorbed silicon-containing layer on the dielectric material. Then, the substrate may be (k) exposed to a plasma based oxidant that simultaneously (1) partially oxidizes the passivation layer on the native metal oxide surface, thereby forming a partially oxidized passivation layer on the native metal oxide surface, and (2) oxidizes the chemi-adsorbed silicon-containing layer on the dielectric material, thereby forming a silicon-containing dielectric film on the dielectric material.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. In a preferred embodiment of the second method, the dielectric material may be selected from the group consisting of silicon oxide, carbon doped silicon oxide, silicon oxynitride, carbon doped oxynitride, silicon nitride, and metal oxide such as zirconium oxide, hafnium oxide, silicon doped zirconium oxide, silicon doped hafnium oxide, or any other high k materials. The metal in this preferred embodiment may be selected from selected from the group consisting of cobalt, aluminum, copper, tantalum, ruthenium, molybdenum, tungsten, platinum, iridium, nickel, titanium, silver, gold, or a combination thereof.

The non-plasma based oxidant used in the second aspect of this disclosure may be selected from the group consisting of hydrogen peroxide (gaseous), oxygen, and ozone. In an even more preferred embodiment, step (b), the reacting the substrate with a non-plasma based oxidant, thereby forming an oxidized metal surface on the metal step, occurs at a temperature less than, or equal to, 150° C.

As described above, the substrate may be heated to less than, or equal to, 150° C., in step (h). In additional embodiments of the second method disclosed herein, the substrate in step (h) may be heated to a temperature of less than, or equal to: 145° C.; 140° C.; 135° C.; 130° C.; 125° C.; 120° C.; 115° C.; 110° C.; 105° C.; 100° C.; 95° C.; 90° C.; 85° C.; 80° C.; 75° C.; 70° C.; 65° C.; 60° C.; 55° C.; or 50° C.

The plasma based oxidant utilized in step (k) can be any plasma that simultaneously (1) partially oxidizes the passivation layer, thereby forming a partially oxidized passivation layer on the oxidized metal surface, and (2) oxidizes the chemi-adsorbed silicon-containing layer, thereby forming a silicon-containing dielectric film on the dielectric material. More specifically, however, the plasma based oxidant may be selected from the group consisting of oxygen plasma, nitrous oxide plasma, and carbon dioxide plasma.

Moving on, in one alternative of the preferred embodiment of this method, the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol. In another alternative of this method, the passivation agent is selected from the group consisting of di-tert-butyl disulfide, and di-heptane disulfide. In a further alternative of the preferred embodiment of this method, the passivation agent may be selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl)benzenethiol, 4-trifluoromethyl-2,3,5,6-tetrafluorothiophenol, 3,5-difluorobenzyl mercaptan, 4-trifluoromethyl-2,3,5,6-tetrafluorothiophenol, and para-trifluoromethylbenzenethiol.

In a preferred embodiment of the second method disclosed herein, the passivation layer may comprise a monolayer of the passivation agent adsorbed to the native metal oxide metal surface. More specifically, the monolayer of the passivation agent may be chemi-adsorbed to the native metal oxide surface. In an additional aspect of the preferred embodiment, the passivation layer may further comprise a second layer of the passivation agent that is physi-adsorbed to the monolayer of the passivation agent that is chemi-adsorbed to the native metal oxide surface.

In a preferred embodiment of the second aspect of the invention, the silicon precursor may be an organoaminomonsilane selected from the group consisting of di-iso-propylaminosilane, di-sec-butylaminosilane, bis(diethylamino)silane, bis(dimethylamino)silane, bis(ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, Iso-propylaminodimethylsilane, tert-pentylaminodimethylaminosilane, dimethylaminomethylsilane, di-iso-propylaminomethylsilane, iso-propyl-sec-butylaminomethylsilane, 2,6-dimethylpiperidinomethylsilane, di-sec-butylaminomethylsilane, bis(dimethylamino)methylsilane, bis(diethylamino)methylsilane, bis(di-iso-propylamino)methylsilane, bis(iso-propyl-sec-butylamino)methylsilane, bis(2,6-dimethylpiperidino)methylsilane, bis(iso-propylamino)methylsilane, bis(tert-butylamino)methylsilane, bis(sec-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, bis(cyclohexylamino)dimethylsilane, and combinations thereof.

Alternatively, the silicon precursor may be an organoaminodisilane selected from the group consisting of di-iso-propylaminodisilane, and di-sec-butylaminodisilane in the preferred embodiment in the second aspect of the invention. Further, in an additional alternative of this embodiment of the second method, the silicon precursor may be an organoaminotrisilylamine selected from the group consisting of di-iso-propylaminotrisilylamine, diethylaminotrisilylamine, iso-propylaminotrisilylamine, and cyclohexylmethylaminotrisilylamine.

In an additional alternative to the second method disclosed herein, the silicon precursor may be an organoaminocyclosiloxane selected from the group consisting of 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8- tetramethylcyclotetrasiloxane, and 2-iso-propylamino-2,4,6, 8-tetramethylcyclotetrasiloxane, 2-pyrrolidino-2,4,6,8-tetramethylcyclotetrasiloxane, and 2-cyclohexyl methylamino-2,4,6,8-tetramethylcyclotetrasiloxane.

Additionally, in a preferred embodiment of the second method, the silicon-containing dielectric film may have a thickness, and the thickness required may be a predetermined value. For example, in order to meet performance requirements, the film thickness may need to be: greater than, or equal to, 5 nanometers; greater than, or equal to, 10 nanometers; greater than, or equal to, 15 nanometers; greater than, or equal to, 20 nanometers; greater than, or equal to, 25 nanometers; greater than, or equal to, 30 nanometers; greater than, or equal to, 35 nanometers; greater than, or equal to, 40 nanometers; greater than, or equal to, 45 nanometers; or greater than, or equal to, 50 nanometers. As such, one embodiment of this second method may include repeating steps (i) through (k) until the thickness of the silicon-containing dielectric film formed on the dielectric material reaches the predetermined value. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to the plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

Alternatively, each exposure in steps (i) through (k) may create a known thickness of the dielectric film. For example, each cycle of steps (i) through (k) may hypothetically create a silicon-containing dielectric film approximately 10 nanometers thick. Further, film property testing may have determined that such film requires a thickness of approximately 40 nanometers to create the film properties sought, and steps (i) through (k) would need to be repeated for four cycles to create a film approximately 40 nanometers thick. As such, in an alternative of this second method, steps (i) through (k) may be repeated for a predetermined number of cycles, as described just above, to obtain the prescribed thickness. In one instance the predetermined number of cycles may be 1. Alternatively, the predetermined number of cycles may be: 2; 3; 4; 5; 6; 7; 8; 9; 10; 11; 12; 13; 14; 15; 16; 17; 18; 19; 20; 21; 22; 23; 24; 25; or more, for example. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to a plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

Additionally, in another alternative of the second method, the silicon-containing dielectric film may have a thickness, and the thickness required may be a predetermined value. For example, as described before, in order to meet performance requirements, the film thickness may need to be: greater than, or equal to, 5 nanometers; greater than, or equal to, 10 nanometers; greater than, or equal to, 15 nanometers; greater than, or equal to, 20 nanometers; greater than, or equal to, 25 nanometers; greater than, or equal to, 30 nanometers; greater than, or equal to, 35 nanometers; greater than, or equal to, 40 nanometers; greater than, or equal to, 45 nanometers; or greater than, or equal to, 50 nanometers. As such, one embodiment of this second method may include repeating steps (j) through (k) until the thickness of the silicon-containing dielectric film formed on the dielectric material reaches the predetermined value. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate the plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

Furthermore, and alternatively, each exposure in steps (j) through (k) may create a known thickness of the dielectric film. For example, each cycle of steps (j) through (k) may hypothetically create a silicon-containing dielectric film approximately 10 nanometers thick. Further, film property testing may have determined that such film requires a thickness of approximately 40 nanometers to create the film properties sought, and steps (j) through (k) would need to be repeated for four cycles to create a film approximately 40 nanometers thick. As such, in an alternative of this second method, steps (j) through (k) may be repeated for a predetermined number of cycles, as described just above, to obtain the prescribed thickness. In one instance the predetermined number of cycles may be 1. Alternatively, the predetermined number of cycles may be: 2; 3; 4; 5; 6; 7; 8; 9; 10; 11; 12; 13; 14; 15; 16; 17; 18; 19; 20; 21; 22; 23; 24; 25; or more, for example. In furtherance of this portion of the second method disclosed herein, the process may further include the steps of (1) reacting the substrate with the non-plasma based oxidant thereby forming an oxidized metal surface on the metal; (m) exposing the substrate to a passivation agent that preferentially adsorbs more onto the oxidized metal surface than the dielectric material, thereby forming a passivation layer on the oxidized metal surface; (n) exposing the substrate to a silicon precursor that preferentially adsorbs more onto the dielectric material than the passivation layer, thereby forming a chemi-adsorbed silicon-containing layer on the dielectric material; and exposing the substrate to the plasma based oxidant that simultaneously (1) partially oxidizes the passivation layer on the oxidized metal surface, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

In an additional limitation to the preferred embodiment of the second method disclosed herein, the reactor may be purged between steps. For example, in one embodiment the reactor may be purged between steps (i) and (j). In another instance, the reactor may be purged between the steps (j) and (k). In a further embodiment, the reactor may be purged between steps (i) and (j), as well as between steps (j) and (k). The reactor purge between any of the steps described above may be selected from the group consisting of flushing the reactor with an inert gas, and exposing the reactor to a vacuum source. Some inert gases that may be utilized include, but are not limited to, helium, argon, and nitrogen.

Selective Plasma Enhanced Deposition of Dielectric Materials Manufactured in Accordance with the Second Aspect of the Invention Disclosed Herein Working Example 2— A-B-C type ALD process using HTT as the blocking molecule, $O_2$ plasma as the oxygen source, and DSBAS or 2-dimethylamino-2,4,6,8-tetramethylcyclotetrasiloxane as the Si precursors.

Silicon wafer substrates with electroplated copper on their surface that was planarized by CMP or with a native oxide surface was placed in a vacuum chamber evacuated to a base pressure of $5 \times 10^{-6}$ Torr. The substrate was heated to 100° C. and a protective layer of HTT was selectively attached on the CMP Cu substrates via the vapor phase at a HTT pressure of 0.38 Torr (50 Pa) for 130 s followed by an Ar purge for 60 s to remove the unreacted thiol. HTT functionalized Cu substrate was exposed to DSBAS vapor at 0.035 Torr (5 Pa) for 57 s or 2-dimethylamino-2,4,6,8-tetramethylcyclotetrasiloxane vapor at 0.050 Torr (7 Pa) for 20 s followed by a 60 s Ar purge to remove any unreacted Si precursor. The substrate was then exposed to a remote 70/30 sccm $O_2$/Ar plasma for 1 s at 150 to complete one cycle of the $SiO_2$ ALD process. Steps 1 through 3 were repeated in an A-B-C type ALD (A=HTT, B=DSBAS or 2-dimethylamino-2,4,6,8-tetramethylcyclotetrasiloxane, C=remote 02 plasma) process up to thirty times for DSBAS and 17 times for 2-dimethylamino-2,4,6,8-tetramethylcyclotetrasiloxane. The exposure time of PFDT was reduced from 500 s to 60 s for the redose cycles. No evidence of $SiO_2$ deposition on the Cu surface was observed based on results from reflection-absorption infrared spectroscopy (RAIRS) and XPS. Characterization of surface morphology with AFM revealed no evidence of damage or roughening of the Cu surface. A similar A-B-C type ALD process on native oxide on a Si wafer surface deposited 5 nm of $SiO_2$ as measured by ex situ variable angle spectroscopic ellipsometry (VASE).

Working Example 3—A-B-C type ALD process using PFDT as the blocking molecule, $O_2$ plasma as the oxygen source, and DSBAS or 2-dimethylamino-2,4,6,8-tetramethylcyclotetrasiloxane as the Si precursors.

Figure 5A:
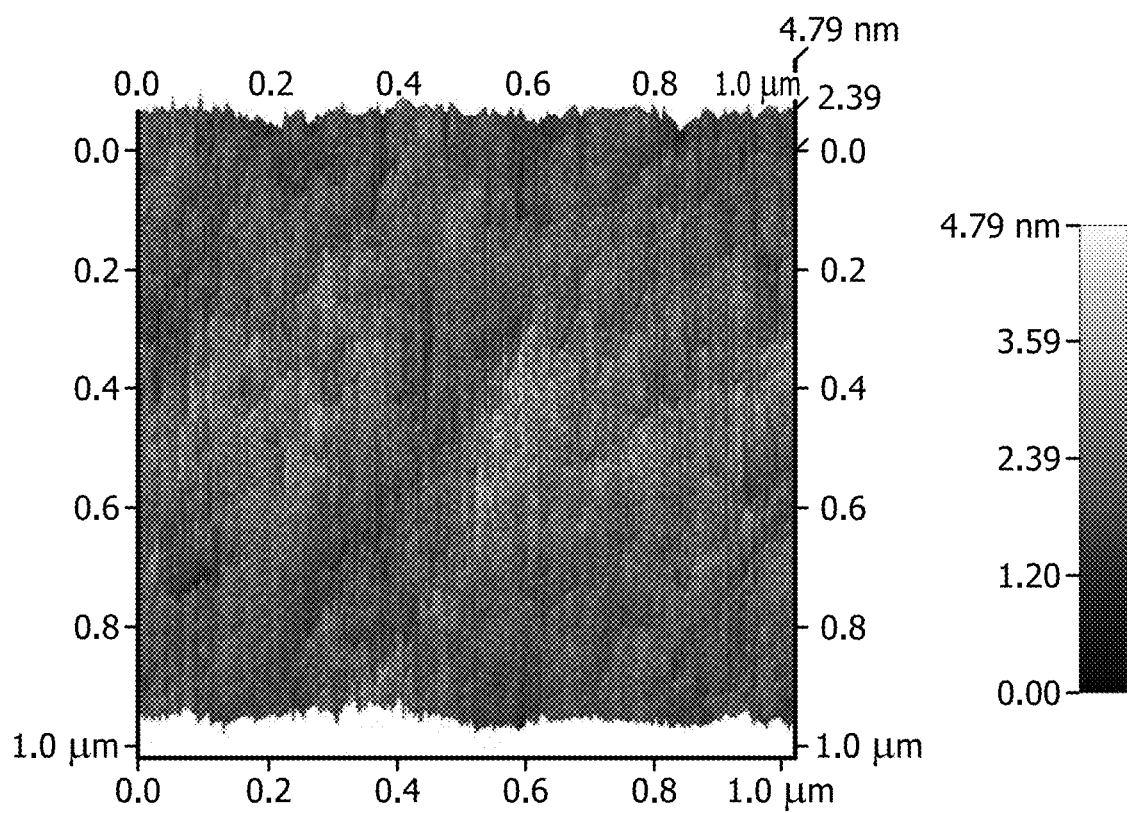
FIG. 5(a) Atomic force microscopy (AFM) image of the initial Cu surface after chemical-mechanical polishing (CMP) with root mean square roughness of 0.4 nm.
Figure 5B:
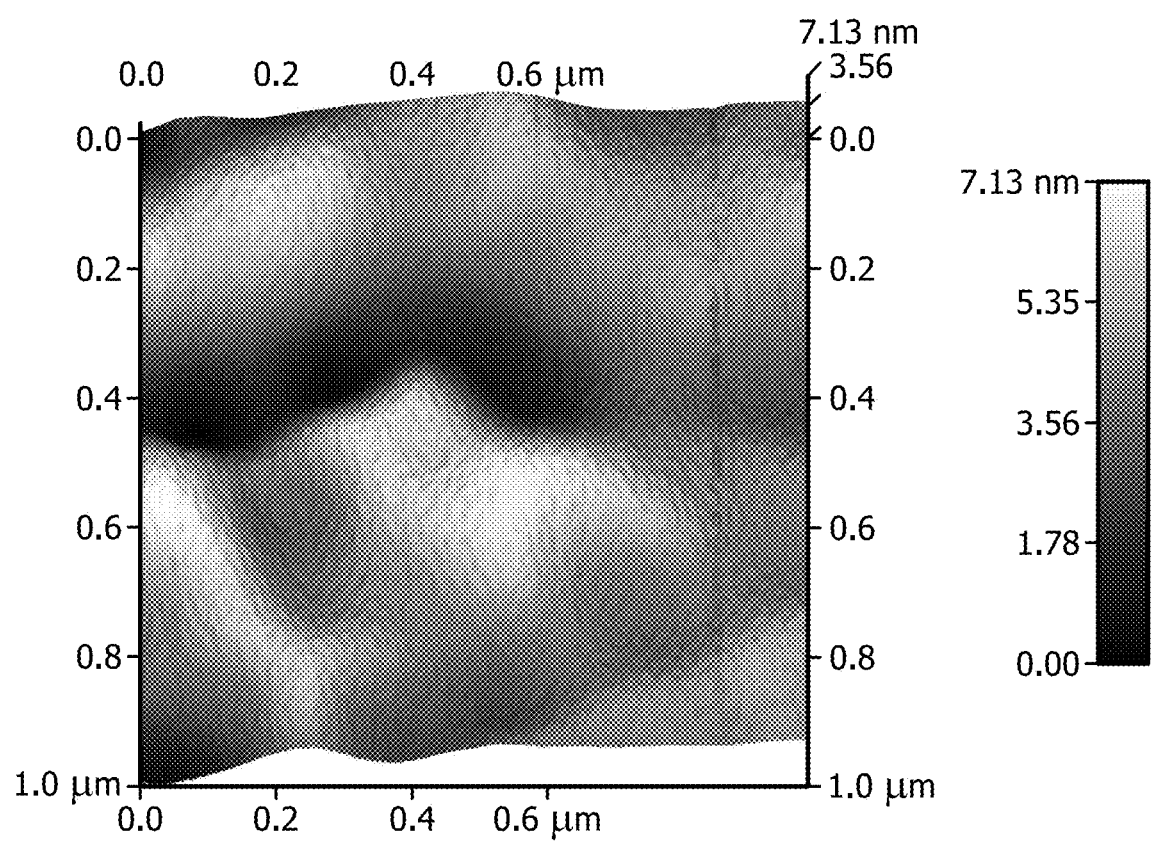
FIG. 5(b) AFM image of Cu with a root mean square roughness of 1.1 nm after A-B-C type ALD process wherein A=PFDT, B=DSBAS, C=remote oxygen plasma at 100° C. as described in Working Example 3, and a post-treatment process inhibitor removal by thermal desorption and cleaning with BHP 851.
Figure 6:
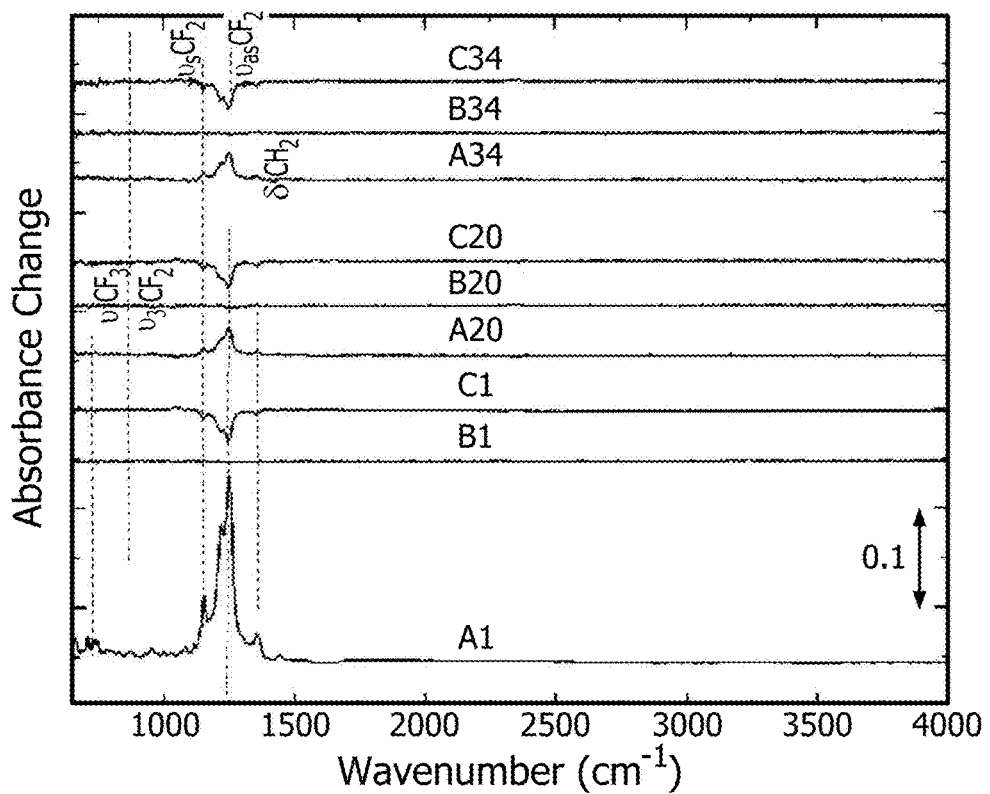
FIG. 6 shows infrared absorbance change during A-B-C type ALD process for the $1^{st}$, $20^{th}$ and $35^{th}$ cycles wherein A=PFDT, B=2-dimethylamino-2,4,6,8-tetramethylcyclotetrasiloxane, C=remote oxygen plasma at 100° C. as described in Example 3. The selectivity is retained during these 34 cycles.
Figure 6:
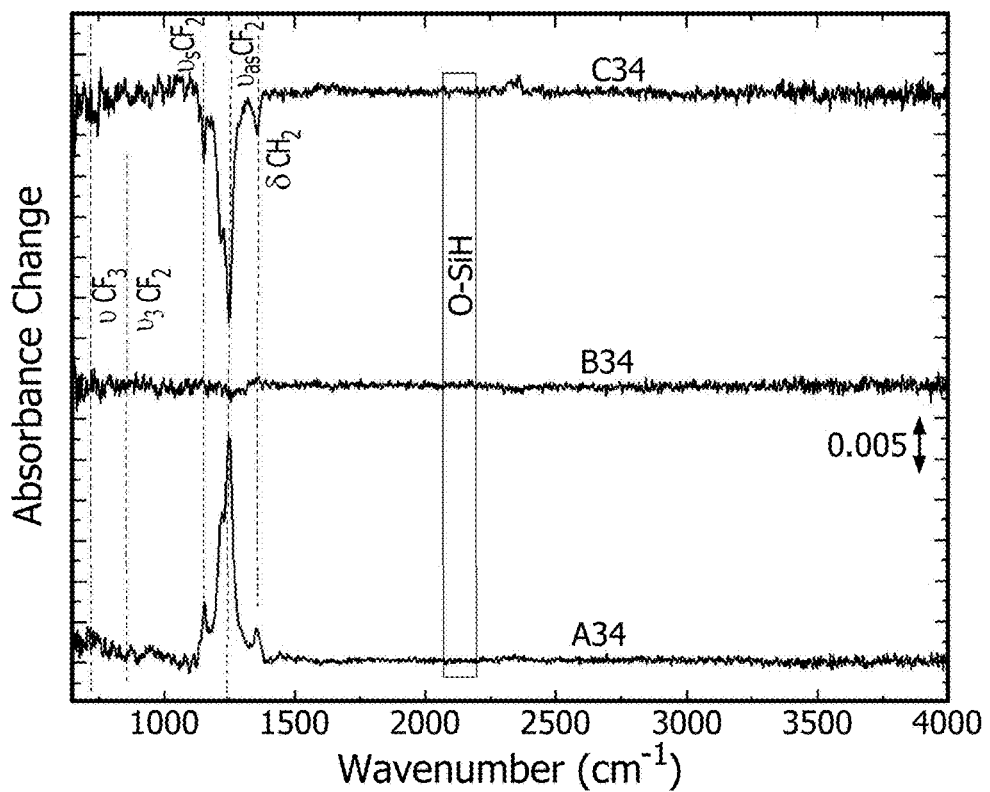

Silicon wafer substrates with electroplated copper on their surface that was planarized by CMP or with a native oxide surface was placed in a vacuum chamber evacuated to a base pressure of $5 \times 10^{-6}$ Torr. The substrate was heated to 100° C. and a protective layer of PFDT was selectively attached on the CMP Cu substrates via the vapor phase at a HTT pressure of 0.38 Torr (50 Pa) for 130 s followed by an Ar purge for 60 s to remove the unreacted thiol. HTT functionalized Cu substrate was exposed to DSBAS vapor at 0.035 Torr (5 Pa) for 57 s or 2-dimethylamino-2,4,6,8-tetramethylcyclotetrasiloxane vapor at 0.050 Torr (7 Pa) for 20 s followed by a 60 s Ar purge to remove any unreacted Si precursor. The substrate was then exposed to a remote 70/30 sccm $O_2$/Ar plasma for 1 s at 150 to complete one cycle of the $SiO_2$ ALD process. Steps 1 through 3 were repeated in an A-B-C type ALD (A=PFDT, B=DSBAS or 2-dimethylamino-2,4,6,8-tetramethylcyclotetrasiloxane, C=remote $O_2$ plasma) process up to thirty-five times. The exposure time of PFDT was reduced from 500 s to 60 s for the redose cycles. No evidence of $SiO_2$ deposition on the Cu surface was observed based on results from reflection-absorption infrared spectroscopy (RAIRS) and XPS. Growth selectivity was determined by comparing high-resolution XPS scans of the Si 2p region for the growth and nongrowth surfaces as shown in FIG. 5. Characterization of surface morphology with AFM revealed no evidence of damage or roughening of the Cu surface. A similar A-B-C type ALD process on native oxide on a Si wafer surface deposited 5 nm of $SiO_2$ for DSBAS and 10 nm for 2-dimethylamino-2,4,6,8-tetramethylcyclotetrasiloxane as measured by ex situ variable angle spectroscopic ellipsometry (VASE).

The above description is meant to be representative only, and thus modifications may be made to the embodiments described herein without departing from the scope of the disclosure. Thus, these modifications fall within the scope of the present disclosure and are intended to fall within the appended claims.

What is claimed is:

1. A selective plasma enhanced atomic layer deposition (ALD) process, comprising:
   (a) loading a substrate comprising a dielectric material, and a metal into a reactor;
   (b) reacting the substrate with a non-plasma based oxidant, thereby forming an oxidized metal surface on the metal;
   (c) heating the substrate to a temperature less than, or equal to, 150° C.;
   (d) exposing the substrate to a passivation agent that preferentially adsorbs more onto the oxidized metal surface than the dielectric material, thereby forming a passivation layer on the oxidized metal surface;
   (e) exposing the substrate to a silicon precursor that preferentially adsorbs more onto the dielectric material than the passivation layer on the oxidized metal surface, thereby forming a chemi-adsorbed silicon-containing layer on the dielectric material; and
   (f) exposing the substrate to a plasma based oxidant that simultaneously (1) partially oxidizes the passivation layer, thereby forming a partially oxidized passivation layer on the oxidized metal surface, and (2) oxidizes the chemi-adsorbed silicon-containing layer on the dielectric material, thereby forming a silicon-containing dielectric film on the dielectric material.

2. The selective plasma enhanced ALD process according to claim 1, wherein the dielectric material is selected from the group consisting of silicon oxide, carbon doped silicon oxide, silicon oxynitride, carbon doped oxynitride, silicon nitride, and metal oxide such as zirconium oxide, hafnium oxide, silicon doped zirconium oxide, silicon doped hafnium oxide, or any other high k materials.

3. The selective plasma enhanced ALD process according to claim 1, wherein the metal is selected from the group consisting of cobalt, aluminum, copper, tantalum, ruthenium, molybdenum, tungsten, platinum, iridium, nickel, titanium, silver, gold or combination thereof.

4. The selective plasma enhanced ALD process according to claim 1, wherein the non-plasma based oxidant is selected from the group consisting of hydrogen peroxide, oxygen, and ozone.

5. The selective plasma enhanced ALD process according to claim 1, wherein step (b), the reacting the substrate with a non-plasma based oxidant, thereby forming an oxidized metal surface on the metal step, occurs at a temperature less than, or equal to, 500° C.

6. The selective plasma enhanced ALD process according to claim 5, wherein step (b), the reacting the substrate with a non-plasma based oxidant, thereby forming an oxidized metal surface on the metal step, occurs at a temperature less than, or equal to, 150° C.

7. The selective plasma enhanced ALD process according to claim 1, wherein the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol.

8. The selective plasma enhanced ALD process according to claim 1, wherein the passivation agent is selected from the group consisting of di-tert-butyl disulfide, and di-heptane disulfide.

9. The selective plasma enhanced ALD process according to claim 1, wherein the passivation agent is selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(trifluoromethyl)benzenethiol, 4-trifluoromethyl-2,3,5,6-tetrafluorothiophenol, 3,5-difluorobenzyl mercaptan, 4-trifluoromethyl-2,3,5,6-tetrafluorothiophenol, and para-trifluoromethylbenzenethiol.

10. The selective plasma enhanced ALD process according to claim 1, wherein the passivation layer comprises a monolayer of the passivation agent chemi-adsorbed to the oxidized metal surface.

11. A selective plasma enhanced atomic layer deposition (ALD) process, comprising:
(g) loading a substrate comprising a dielectric material, and metal having a native metal oxide surface into a reactor;
(h) heating the substrate to a temperature less than, or equal to, 150° C.;
(i) exposing the substrate to a passivation agent that preferentially adsorbs more onto the native metal oxide surface than the dielectric material, thereby forming a passivation layer on the native metal oxide surface;
(j) exposing the substrate to a silicon precursor that preferentially adsorbs more onto the dielectric material than the passivation layer on the native metal oxide surface, thereby forming a chemi-adsorbed silicon-containing layer on the dielectric material; and
(k) exposing the substrate to a plasma based oxidant that simultaneously (1) partially oxidizes the passivation layer on the native metal oxide surface, thereby forming a partially oxidized passivation layer on the native metal oxide surface, and (2) oxidizes the chemi-adsorbed silicon-containing layer on the dielectric material, thereby forming a silicon-containing dielectric film on the dielectric material.

12. The selective plasma enhanced ALD process according to claim 11, wherein the dielectric material is selected from the group consisting of silicon oxide, carbon doped silicon oxide, silicon oxynitride, carbon doped oxynitride, silicon nitride, and metal oxide such as zirconium oxide, hafnium oxide, silicon doped zirconium oxide, silicon doped hafnium oxide, or any other high k materials.

13. The selective plasma enhanced ALD process according to claim 11, wherein the metal is selected from the group consisting of cobalt, aluminum, copper, tantalum, ruthenium, molybdenum, tungsten, platinum, iridium, nickel, titanium, silver, gold, or combination thereof.

14. The selective plasma enhanced ALD process according to claim 11, wherein the plasma based oxidant is selected from the group consisting of oxygen plasma, nitrous oxide plasma, and carbon dioxide plasma.

15. The selective plasma enhanced ALD process according to claim 11, wherein the passivation agent is selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, tetrahydro-2H-pyran-4-thiol, 2-Propene-1-thiol, tetrahydro-2H-pyran-4-thiol, thiophenol, 4-methyl-1-thiophenol, 3-methyl-1-thiophenol, 2-Methyl-1-thiophenol, and para-xylene-alpha-thiol.

16. The selective plasma enhanced ALD process according to claim 11, wherein the passivation agent is selected from the group consisting of di-tert-butyl disulfide, and di-heptane disulfide.

17. The selective plasma enhanced ALD process according to claim 11, wherein the passivation agent is selected from the group consisting of 1H,1H,2H,2H-perfluorodecanethiol, 2,2,2-trifluoroethanethiol, 4-methyl-6-trifluoromethyl-pyrimidine-2-thiol, 4-trifluoromethylbenzyl mercaptan, 4-(trifluoromethoxy)benzyl mercaptan, 4-fluorobenzyl mercaptan, 3,5-bis(trifluoromethyl)benzenethiol, 2-(Trifluoromethyl)benzenethiol, 4-trifluoromethyl-2,3,5,6-tetrafluorothiophenol, 3,5-difluorobenzyl mercaptan, 4-trifluoromethyl-2,3,5,6-tetrafluorothiophenol, and para-trifluoromethylbenzenethiol.

18. The selective plasma enhanced ALD process according to claim 11, wherein the passivation layer comprises a monolayer of the passivation agent chemi-adsorbed to the native metal oxide surface.

19. The selective plasma enhanced ALD process according to claim 18, wherein the passivation layer further comprises a second layer of the passivation agent physi-adsorbed to the monolayer of the passivation agent chemi-adsorbed to the native metal oxide surface.

20. The selective plasma enhanced ALD process according to claim 11, wherein the silicon precursor is an organoaminomonsilane selected from the group consisting of di-iso-propylaminosilane, di-sec-butylaminosilane, bis(diethylamino)silane, bis(dimethylamino)silane, bis(ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, Iso-propylaminodimethylsilane, tert-pentylaminodimethylaminosilane, dimethylaminomethylsilane, di-iso-propylaminomethylsilane, iso-propyl-sec-butylaminomethylsilane, 2,6-dimethylpiperidinomethylsilane, di-sec-butylaminomethylsilane, bis(dimethylamino)methylsilane, bis(diethylamino)methylsilane, bis(di-iso-propylamino)methylsilane, bis(iso-propyl-sec-butylamino)methylsilane, bis(2,6-dimethylpiperidino)methylsilane, bis(iso-propylamino)methylsilane, bis(tert-butylamino)methylsilane, bis(sec-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, bis(cyclohexylamino)dimethylsilane, and combinations thereof.

\* \* \* \* \*